United States Patent
Lee et al.

(10) Patent No.: US 9,509,338 B2
(45) Date of Patent: Nov. 29, 2016

(54) APPARATUS AND METHOD FOR PROCESSING DATA

(71) Applicant: SK HYNIX INC., Icheon (KR)

(72) Inventors: Sang Eun Lee, Icheon (KR); Chang il Kim, Cheongju (KR); Oung Sic Cho, Icheon (KR)

(73) Assignee: SK HYNIX INC., Icheon (KR)

(*) Notice: Subject to any disclaimer, the term of this patent is extended or adjusted under 35 U.S.C. 154(b) by 315 days.

(21) Appl. No.: 14/288,232

(22) Filed: May 27, 2014

(65) Prior Publication Data

US 2015/0188566 A1 Jul. 2, 2015

(30) Foreign Application Priority Data

Dec. 31, 2013 (KR) ........................ 10-2013-0168660

(51) Int. Cl.
*G06F 13/24* (2006.01)
*H03M 7/30* (2006.01)
*H03M 7/48* (2006.01)

(52) U.S. Cl.
CPC ............. *H03M 7/6058* (2013.01); *H03M 7/48* (2013.01)

(58) Field of Classification Search
None
See application file for complete search history.

(56) References Cited

U.S. PATENT DOCUMENTS

| 5,179,711 | A | 1/1993 | Vreeland | |
|---|---|---|---|---|
| 5,710,719 | A * | 1/1998 | Houle | G06T 9/40 341/60 |
| 5,748,904 | A * | 5/1998 | Huang | G06T 9/005 345/544 |
| 7,365,673 | B2 * | 4/2008 | Makkapati | G01S 7/003 342/179 |
| 7,742,926 | B2 * | 6/2010 | Reznik | H04B 1/662 704/219 |
| 2002/0154040 | A1 | 10/2002 | Vataja | |
| 2011/0196849 | A1 * | 8/2011 | Hays | H03M 7/46 707/693 |
| 2012/0239889 | A1 * | 9/2012 | Lee | G06F 12/0246 711/154 |
| 2015/0067436 | A1 * | 3/2015 | Hu | G06F 11/1008 714/758 |

* cited by examiner

*Primary Examiner* — Elias Mamo

(57) ABSTRACT

A data processing device includes a compression circuit and a padding circuit. The compression circuit is configured to compare pairs of two contiguous bits within data composed of 2n bits (where n is a natural number), and compress the data based on a result of the comparison. The padding circuit is configured to generate transmission data of 2n bits by padding the compressed data with a dummy pad.

20 Claims, 12 Drawing Sheets

|    | B0 | B1 | B2 | B3 | B4 | B5 | B6 | B7 | B8 | B9 | B10 | B11 | B12 | B13 | B14 | B15 |
|----|----|----|----|----|----|----|----|----|----|----|-----|-----|-----|-----|-----|-----|
| D0 | 0  | 1  | 1  | 0  | 1  | 1  | 0  | 1  | 1  | 0  | 1   | 1   | 0   | 1   | 1   | 0   |
| D1 | 0  | 1  | 1  | 0  | 1  | 1  | 0  | 1  | 1  | 0  | 1   | 1   | 0   | 1   | 1   | 0   |
| D2 | 0  | 1  | 0  | 0  | 1  | 0  | 0  | 1  | 0  | 0  | 1   | 0   | 0   | 1   | 0   | 0   |
| D3 | 0  | 1  | 0  | 0  | 1  | 0  | 0  | 1  | 0  | 0  | 1   | 0   | 0   | 1   | 0   | 0   |
| D4 | 1  | 0  | 1  | 1  | 0  | 1  | 1  | 0  | 1  | 1  | 0   | 1   | 1   | 0   | 1   | 1   |
| D5 | 1  | 0  | 0  | 1  | 0  | 0  | 1  | 0  | 0  | 1  | 0   | 0   | 1   | 0   | 1   | 1   |
| D6 | 1  | 0  | 0  | 1  | 0  | 0  | 1  | 0  | 0  | 1  | 0   | 0   | 1   | 0   | 0   | 1   |
| D7 | 1  | 0  | 0  | 1  | 0  | 0  | 1  | 0  | 0  | 1  | 0   | 0   | 1   | 0   | 0   | 1   |

Fig.3

| | CB0 | CB1 | CB2 | CB3 | CB4 | CB5 | CB6 | CB7 | CB8 | CB9 | CB10 | CB11 | CB12 | CB13 | CB14 | CB15 |
|---|---|---|---|---|---|---|---|---|---|---|---|---|---|---|---|---|
| CDQ0 | 0 | 1 | 1 | 0 | 1 | 1 | 0 | 1 | 1 | 0 | 1 | 1 | 0 | 1 | 1 | 0 |
| CDQ1 | 0 | 1 | 0 | 0 | 1 | 0 | 0 | 1 | 0 | 0 | 1 | 0 | 0 | 1 | 0 | 0 |
| CDQ2 | 1 | 0 | 1 | 1 | 0 | 1 | 1 | 0 | 1 | 1 | 0 | 1 | 1 | 0 | 1 | 1 |
| CDQ3 | 1 | 0 | 0 | 1 | 0 | 0 | 1 | 0 | 0 | 1 | 0 | 0 | 1 | 0 | 0 | 1 |
| CF | 1 | 1 | 1 | 1 | 1 | 1 | 1 | 1 | 1 | 1 | 1 | 1 | 1 | 1 | 1 | 1 |

Fig.4

| | CB0 | CB1 | CB2 | CB3 | CB4 | CB5 | CB6 | CB7 | CB8 | CB9 | CB10 | CB11 | CB12 | CB13 | CB14 | CB15 |
|---|---|---|---|---|---|---|---|---|---|---|---|---|---|---|---|---|
| DQ0 | 0 | 1 | 1 | 0 | 1 | 1 | 0 | 1 | 1 | 0 | 1 | 1 | 0 | 1 | 1 | 0 |
| DQ1 | 0 | 1 | 0 | 0 | 1 | 0 | 0 | 1 | 0 | 0 | 1 | 0 | 0 | 1 | 0 | 0 |
| DQ2 | 1 | 0 | 1 | 1 | 0 | 1 | 1 | 0 | 1 | 1 | 0 | 1 | 1 | 0 | 1 | 1 |
| DQ3 | 1 | 0 | 0 | 1 | 0 | 0 | 1 | 0 | 0 | 1 | 0 | 0 | 1 | 0 | 0 | 1 |
| DQ4 | D | D | D | D | D | D | D | D | D | D | D | D | D | D | D | D |
| DQ5 | D | D | D | D | D | D | D | D | D | D | D | D | D | D | D | D |
| DQ6 | D | D | D | D | D | D | D | D | D | D | D | D | D | D | D | D |
| DQ7 | D | D | D | D | D | D | D | D | D | D | D | D | D | D | D | D |
| CF  | 1 | 1 | 1 | 1 | 1 | 1 | 1 | 1 | 1 | 1 | 1 | 1 | 1 | 1 | 1 | 1 |

Fig.5

|    | B0 | B1 | B2 | B3 | B4 | B5 | B6 | B7 | B8 | B9 | B10 | B11 | B12 | B13 | B14 | B15 |
|----|----|----|----|----|----|----|----|----|----|----|-----|-----|-----|-----|-----|-----|
| D0 | 0  | 1  | 1  | 0  | 1  | 1  | 0  | 1  | 1  | 0  | 1   | 1   | 0   | 1   | 1   | 0   |
| D1 | 0  | 1  | 1  | 0  | 1  | 1  | 0  | 1  | 1  | 0  | 1   | 1   | 0   | 1   | 1   | 0   |
| D2 | 0  | 1  | 0  | 0  | 1  | 0  | 0  | 1  | 0  | 0  | 1   | 0   | 0   | 1   | 0   | 0   |
| D3 | 0  | 1  | 0  | 1  | 1  | 0  | 0  | 0  | 0  | 0  | 0   | 1   | 0   | 1   | 1   | 0   |
| D4 | 1  | 0  | 1  | 1  | 0  | 1  | 1  | 0  | 1  | 1  | 0   | 1   | 1   | 0   | 1   | 1   |
| D5 | 1  | 0  | 0  | 1  | 0  | 0  | 1  | 1  | 0  | 1  | 0   | 1   | 1   | 0   | 1   | 1   |
| D6 | 1  | 0  | 0  | 1  | 0  | 0  | 1  | 0  | 0  | 1  | 0   | 0   | 1   | 0   | 0   | 1   |
| D7 | 1  | 0  | 0  | 1  | 0  | 0  | 1  | 0  | 0  | 1  | 0   | 0   | 1   | 0   | 0   | 1   |

Fig.6

|     | CB0 | CB1 | CB2 | CB3 | CB4 | CB5 | CB6 | CB7 | CB8 | CB9 | CB10 | CB11 | CB12 | CB13 | CB14 | CB15 |
| --- | --- | --- | --- | --- | --- | --- | --- | --- | --- | --- | --- | --- | --- | --- | --- | --- |
| DQ0 | 0 | 1 | 1 | 0 | 1 | 1 | 0 | 1 | 1 | 0 | 1 | 1 | 0 | 1 | 1 | 0 |
| DQ1 | 0 | 1 | 0 | 0 | 1 | 0 | 0 | 1 | 0 | 0 | 1 | 1 | 0 | 1 | 1 | 0 |
| DQ2 | 1 | 0 | 1 | 0 | 0 | 1 | 1 | 1 | 1 | 1 | 0 | 0 | 1 | 0 | 0 | 1 |
| DQ3 | 1 | 0 | 0 | 1 | 0 | 0 | 1 | 0 | 0 | 1 | 0 | 1 | 1 | 0 | 1 | 1 |
| DQ4 | D | D | D | 1 | D | D | D | 0 | D | D | D | 1 | D | D | 1 | D |
| DQ5 | D | D | D | 1 | D | D | D | 1 | D | D | D | 1 | D | D | 1 | D |
| DQ6 | D | D | D | 1 | D | D | D | 0 | D | D | D | 0 | D | D | 0 | D |
| DQ7 | D | D | D | 1 | D | D | 1 | 0 | D | D | D | 0 | D | D | 0 | D |
| CF  | 1 | 1 | 1 | 0 | 1 | 1 | 1 | 0 | 1 | 1 | 1 | 0 | 1 | 1 | 0 | 1 |

Fig.7

| | CB0 | CB1 | CB2 | CB3 | CB4 | CB5 | CB6 | CB7 | CB8 | CB9 | CB10 | CB11 | CB12 | CB13 | CB14 | CB15 |
|---|---|---|---|---|---|---|---|---|---|---|---|---|---|---|---|---|
| DQ0 | 0 | 1 | 1 | 0 | 1 | 1 | 0 | 1 | 1 | 0 | 1 | 1 | 0 | 1 | 1 | 0 |
| DQ1 | 0 | 1 | 0 | 0 | 1 | 0 | 0 | 1 | 0 | 0 | 1 | 1 | 0 | 1 | 1 | 0 |
| DQ2 | 1 | 0 | 1 | 1 | 0 | 1 | 1 | 1 | 1 | 1 | 0 | 0 | 1 | 0 | 1 | 1 |
| DQ3 | 1 | 0 | 0 | 1 | 0 | 0 | 1 | 0 | 0 | 1 | 0 | 1 | 1 | 0 | 0 | 1 |
| DQ4 | D | D | D | D | D | D | D | 0 | D | D | D | 1 | D | D | D | D |
| DQ5 | D | D | D | D | D | D | D | 1 | D | D | D | 1 | D | D | D | D |
| DQ6 | D | D | D | D | D | D | D | 0 | D | D | D | 1 | D | D | D | D |
| DQ7 | D | D | D | D | D | D | 1 | 0 | 1 | 1 | 1 | 0 | 1 | 1 | D | D |
| CF | 1 | 1 | 1 | 0→1 | 1 | 1 | 1 | 0 | 1 | 1 | 1 | 0 | 1 | 1 | 0→1 | 1 |
| | | | | 1 bit error | | | 2 bit error | | | 2 bit error | | | | | 1 bit error | |

Fig.8

|     | CB0 | CB1 | CB2 | CB3 | CB4 | CB5 | CB6 | CB7 | CB8 | CB9 | CB10 | CB11 | CB12 | CB13 | CB14 | CB15 |
| --- | --- | --- | --- | --- | --- | --- | --- | --- | --- | --- | --- | --- | --- | --- | --- | --- |
| DQ0 | 0 | 1 | 1 | 0 | 1 | 1 | 0 | 1 | 1 | 0 | 1 | 1 | 0 | 1 | 1 | 0 |
| DQ1 | 0 | 1 | 0 | 1 | 1 | 0 | 0 | 0 | 0 | 0 | 1 | 1 | 0 | 1 | 1 | 0 |
| DQ2 | 1 | 0 | 1 | 1 | 0 | 1 | 1 | 0 | 1 | 1 | 0 | 1 | 1 | 0 | 1 | 1 |
| DQ3 | 1 | 0 | 0 | 1 | 0 | 0 | 1 | 0 | 0 | 1 | 0 | 0 | 1 | 0 | 0 | 1 |
| DQ4 | D | D | D | D | D | D | D | D | D | D | D | D | D | D | D | D |
| DQ5 | D | D | D | D | D | D | D | D | D | D | D | D | D | D | D | D |
| DQ6 | D | D | D | D | D | D | D | D | D | D | D | D | D | D | D | D |
| DQ7 | D | D | D | D | D | D | D | D | D | D | D | D | D | D | D | D |
| CF  | 1 | 1 | 1 | 1 | 1 | 1 | 1 | 0→1 | 1 | 1 | 1 | 0→1 | 1 | 1 | 1 | 1 |
|     |   |   |   |   |   |   |   | 2 bit error |   |   |   | 2 bit error |   |   |   |   |

Fig.9

| | CF0 | CF1 | CB0 | CB1 | CB2 | CB3 | CB4 | CB5 | CB6 | CB7 | CB8 | CB9 | CB10 | CB11 | CB12 | CB13 | CB14 | CB15 |
|---|---|---|---|---|---|---|---|---|---|---|---|---|---|---|---|---|---|---|
| DQ0 | 1 | 1 | 0 | 1 | 1 | 0 | 1 | 1 | 0 | 1 | 1 | 0 | 1 | 1 | 0 | 1 | 1 | 0 |
| DQ1 | 1 | 1 | 0 | 1 | 0 | 1 | 1 | 0 | 0 | 0 | 0 | 0 | 1 | 1 | 0 | 1 | 1 | 0 |
| DQ2 | 1 | 1 | 1 | 0 | 1 | 1 | 0 | 1 | 1 | 0 | 1 | 1 | 0 | 1 | 1 | 0 | 1 | 1 |
| DQ3 | 1 | 1 | D | 0 | 0 | 1 | 0 | 0 | 1 | 0 | 0 | 1 | 0 | 0 | 1 | 0 | 0 | 1 |
| DQ4 | 1 | 1 | D | D | D | D | D | D | D | D | D | D | D | D | D | D | D | D |
| DQ5 | 1 | 1 | D | D | D | D | D | D | D | D | D | D | D | D | D | D | D | D |
| DQ6 | 1 | 1 | D | D | D | D | D | D | D | D | D | D | D | D | D | D | D | D |
| DQ7 | 1 | 1 | D | D | D | D | D | D | D | D | D | D | D | D | D | D | D | D |

Fig. 10

APPARATUS AND METHOD FOR PROCESSING DATA

CROSS-REFERENCE TO RELATED APPLICATION

This application claims priority based upon Korean patent application No. 10-2013-0168660, filed on Dec. 31, 2013, the disclosure of which is hereby incorporated in its entirety by reference herein.

BACKGROUND

Embodiments of the present disclosure relate to an apparatus and method for processing data, and more particularly, to an apparatus and method for processing data, capable of compressing data and transmitting/receiving the compressed data.

In recent times, as the desire for smaller-sized and higher-speed electronic appliances has increased, research into miniaturization and increasing the speed of electronic appliances has been conducted. For miniaturization of electronic appliances, techniques for miniaturizing circuits included in the electronic appliance may be used. For implementation of higher-speed electronic appliances, techniques for improving internal signal transmission timing may be used.

When a process for implementing a specific operational purpose of the electronic appliance is simplified, circuits within the electronic appliance can be simplified and the internal operating speed of the circuits can be increased, such that smaller-sized and higher-speed electronic appliances can be achieved.

SUMMARY

Various embodiments of the present disclosure are directed to an apparatus and method for processing data that substantially obviates one or more problems due to limitations and disadvantages of the related art.

Embodiments of the present disclosure include an apparatus and method for processing data which can reduce an amount of transmission (Tx) data by performing data compression on the basis of transmission/reception (Tx/Rx) data values and can increase a speed of data transmission.

An embodiment relates to an apparatus and method for processing data, which can perform data processing optimal for each operation by changing a compression scheme according to characteristics of Tx/Rx data.

In an embodiment, a data processing device includes a controller. The controller includes a compression circuit configured to compare pairs of two contiguous bits of data composed of 2n bits, where n is a natural number, and compress the data according to a result of the comparisons. The controller also includes a padding circuit configured to generate transmission (Tx) data of 2n bits by padding the compressed data with a dummy pad.

In another embodiment, a data processing method includes comparing pairs of two contiguous bits of data composed of 2n bits, where n is a natural number, compressing the data according to a result of the comparison, generating flag information indicating compression or non-compression of the data, generating transmission (Tx) data of 2n bits by padding the compressed data with a dummy pad, and transmitting the Tx data and the flag information through a physical connector.

Both the foregoing general description and the following detailed description of the present invention are illustrative and explanatory, and are intended to provide further explanation of the invention as claimed.

BRIEF DESCRIPTION OF THE DRAWINGS

The above and other embodiments will become apparent by reference to the following detailed description when considered in conjunction with the accompanying drawings.

FIGS. 3 to 5 show binary data and data formats in a lossless mode according to an embodiment.

FIGS. 6 to 9 show binary data and data formats in a loss mode according to an embodiment.

FIG. 10 shows binary data and data formats according to an embodiment.

DETAILED DESCRIPTION

Reference will now be made in detail to the embodiments, some of which are illustrated in the accompanying drawings. Wherever possible, the same reference numbers will be used throughout the drawings to refer to the same or like parts.

In association with embodiments, specific structural and functional descriptions are disclosed for illustrative purposes. Embodiments can be implemented in various ways without departing from the scope or spirit of the present disclosure.

Figure 1:
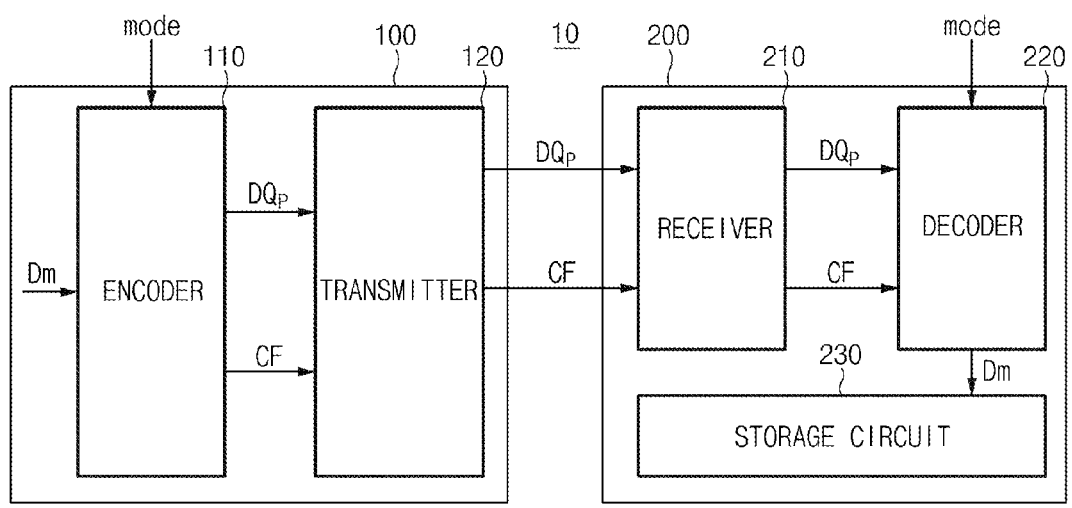
FIG. 1 illustrates a block diagram of a data processing apparatus according to an embodiment.

FIG. 1 is a block diagram illustrating a data processing apparatus 10 according to an embodiment. The data processing apparatus 10 includes a controller 100 and a memory device 200.

The controller 100 generates various signals for controlling the memory device 200, and transmits the generated signals to the memory device 200. The controller 100 may transmit various data and control signals such as commands and address signals to the memory device 200, including transmission (Tx) data $DQ_P$ and flag information CF.

Although not shown in the drawings, in an embodiment, the controller 100 receives data from the memory device 200. The received (Rx) data may be compressed and processed by the memory device 200 in the same manner as when the controller 100 compresses and processes Tx data $DQ_P$ to be transmitted to the memory device 200. The controller 100 receives the Rx data from the memory device 200, and at the same time receives flag information CF indicating compression or non-compression of the Rx data. The controller 100 includes an encoder 110 and a transmitter 120.

The encoder 110 determines a compression scheme on the basis of a mode signal mode, and compresses data Dm of 2n bits, where n is a natural number. The encoder 110 may pad the compressed data with one or more dummy bits so that the encoder 110 generates Tx data $DQ_P$ composed of 2n bits. The encoder 110 also generates flag information CF indicating compression or non-compression of the data Dm.

The encoder 110 compares pairs of contiguous bits of the 2n bits of data Dm to each other. In more detail, the data Dm is composed of n bit-pairs. The encoder 110 compares the bits of each of the n bit-pairs to each other and performs data compression according to the comparison results. Since the encoder 110 compares values of bits included in the data Dm with each other and then performs data compression, additional information, such as a dictionary or look-up table, is not required to perform the compression. The data processing apparatus 10 can reduce the amount of information through data compression, need not use additional information for the data compression, and thus can be implemented as a simple structure.

The transmitter 120 receives the Tx data DQp and the flag information CF from the encoder 110 and transmits the Tx data $DQ_P$ and the flag information CF to the memory device 200. In an embodiment, the Tx data $DQ_P$ and the flag information CF are supplied to the memory device 200 through separate physical connectors, respectively.

In another embodiment, the Tx data $DQ_P$ and the flag information CF are transmitted through a same physical connector. If the Tx data $DQ_P$ and the flag information CF are transmitted through the same physical connector, the flag information CF may be attached to a front end or a back end of the Tx data $DQ_P$, such that the resultant data including the flag information CF can be transmitted. FIG. 10, discussed below, relates to an embodiment in which the flag information CF and the Tx data $DQ_P$ are transmitted through a same physical connector.

The memory device 200 includes a receiver 210 and a decoder 220. The receiver 210 receives the Tx data $DQ_P$ and the flag information CF from the controller 100, and provides the received Tx data $DQ_P$ and flag information CF to the decoder 220.

The decoder 220 determines the scheme used for compressing the Tx data DQp using the mode signal mode, and determines whether the data Dm is compressed or not using the flag information CF. Accordingly, the compression of Tx data $DQ_P$ is reversed, that is, the Tx data $DQ_P$ is decompressed, and the data Dm is recovered.

The memory device 200 may further include a storage circuit 230. The storage circuit 230 may be capable of storing the recovered data Dm and may include a memory cell array. The storage circuit 230 may include a memory cell array composed of volatile or non-volatile memory cells.

The controller 100 and the memory device 200 shown in FIG. 1 may be used as physical components, populated on a printed circuit board (PCB), and interconnected through the PCB, such that the controller 100 and the memory device 200 may each be circuits in different hardware devices.

Figure 2:
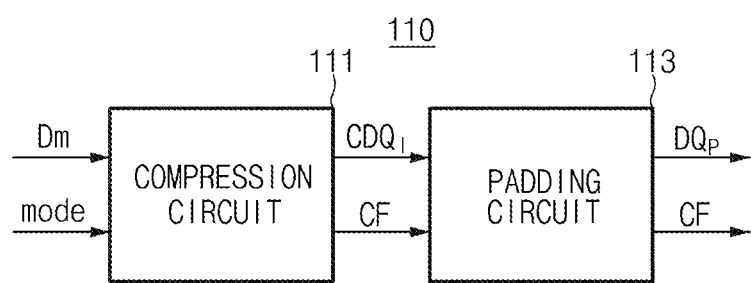
FIG. 2 illustrates a block diagram of an encoder of FIG. 1 according to an embodiment.

FIG. 2 is a block diagram illustrating the encoder 110 of FIG. 1 according to an embodiment. The encoder 110 includes a compression circuit 111 and a padding circuit 113.

The compression circuit 111 determines a compression scheme according to the mode signal mode, and compresses the data Dm on the basis of the determined compression scheme. The compression circuit 111 provides compressed data $CDQ_I$ and the flag information CF indicating compression or non-compression of the data Dm to the padding circuit 113.

If the bits of pairs of two contiguous bits of the data Dm are identical, the compression circuit 111 may compress the two-bit pairs into one bit. If the bits of pairs of two contiguous bits are different, the two bits may or may not be compressed, depending on the mode signal mode.

In an embodiment, the mode signal mode may specify one or more of a loss mode and a lossless mode in association with the compression scheme. In the loss mode, the maximum number of bits allowed to be lost may be established by the mode signal mode. In addition, if data is compressed in the loss mode, that is, under the condition that data loss is allowed, the mode signal mode may further include specific information indicating how to determine which specific bit information will be lost.

If the mode signal mode corresponds to the lossless mode, the compression circuit 111 does not compress two bits that are different from each other. If the mode signal mode corresponds to the loss mode, the compression circuit 111 may perform data compression by replacing two different bits with one bit, or may give priority to one of the two bits and replace the two bits with one bit equal to the bit having priority. In an embodiment, when the compression circuit 111 compresses the data Dm in the loss mode, it sequentially assigns priority in the order from a most significant bit (MSB) to a least significant bit (LSB). The compression circuit 111 then selects a bit having a higher priority of the bits in a bit-pair, and replaces a bit having a lower priority of the bits in the bit-pair, that is, the bit to be lost, with the selected bit.

In an embodiment, the loss mode may be used during processing of graphic data. When processing the graphic data using the loss mode, although a predetermined number of bits are lost, no fatal error occurs in graphic data supplied to a user and a higher operation speed can be achieved.

In an embodiment, an allowable number of bits to be lost are indicated by the mode signal mode. In an embodiment, the compression circuit 111 compares 8 bit-pairs (that is, 16 bits of data) included in the data Dm with each other. The comparison result may indicate that the bits in three bit-pairs have the same values, indicating that these three bit pairs can be compressed without data loss. The comparison result may also indicate that the bits of 5 bit-pairs have different values, indicating that it is impossible to perform data compression without data loss.

If the mode signal mode corresponds to the loss mode, each of the five bit-pairs having different bits may be replaced with one bit so that the resultant bit-pairs may be compressed. As a result, the replaced bit is lost from each of the 5 bit-pairs in the data compression process, and thus 5 bits are unavoidably lost. If the lost bits were necessary to an operation, the operation may encounter unexpected errors. Accordingly, the mode signal mode may specify a number of lost bits to be less than a predetermined number of bits.

If the mode signal mode indicates that only two bits from among 16-bit data Dm can be lost, only two bit-pairs from among the 5 bit-pairs having different bits may be compressed in the loss mode, and accordingly the compression circuit 111 selects two bit-pairs to be compressed. When the compression circuit 111 selects the two bit-pairs to be compressed, a predetermined criteria for the selection may be used. In an embodiment, during the compression process, the compression circuit 111 may first discard or lose the least significant bit (LSB), and gradually reduces a loss rate of bits as the bit location approaches the most significant bit (MSB).

A data processing apparatus and method according to an embodiment will hereinafter be described with reference to FIGS. 3 through 10. FIGS. 3 through 10 are tables showing binary data, and associated data processing will be described with reference to the block diagrams shown in FIGS. 1 and 2. FIGS. 3 through 10 illustrate an embodiment wherein data has a burst length of 16, each burst comprising 8 bits.

FIG. 3 shows data Dm received from an external source by the controller 100 of FIG. 1. FIG. 4 shows flag information CF and compressed data $CDQ_I$ obtained when the data Dm of FIG. 3 is compressed by the compression circuit 111.

FIG. 5 shows the flag information CF and Tx data $DQ_P$ obtained after the padding circuit 113 appends a dummy pad to the compressed data $CDQ_I$.

FIG. 3 shows a total of 128 bits of the data Dm that are to be processed by the controller 100. Bits D0 through D7 of the portion of the data Dm provided at each of $1^{st}$ through $16^{th}$ points in time will hereinafter be denoted as $1^{st}$ through $16^{th}$ bursts B0 through B15. The first burst B0 corresponds to "00001111", the second burst B1 corresponds to "11110000", and the third burst B2 corresponds to "11001100," and so on.

When the compression circuit 111 compares two contiguous bits of the data Dm with each other, the two bits compared may be two contiguous bits of one burst.

In FIG. 3, the first burst B0 of the data Dm is denoted by "00001111". Four bit-pairs, each of which includes two contiguous bits (i.e., a bit-pair) of the first burst B0, therefore contain "00", "00", "11", and "11". The compression circuit 111 compares the bits in each bit-pair with each other and determines that the bits in each bit-pair have a same value. If the bits in each bit-pair have the same value, the compression circuit 111 compresses each of the bit-pairs into one bit.

Accordingly, referring to FIG. 4, a first compression burst CB0 of the compressed data $CDQ_I$ produced by the compression circuit 111 has the value of "0011", and $2n$ bits of the data Dm are compressed into n bits.

Likewise, the second burst B1 of the data Dm is comprised of bit-pairs "11", "11", "00", and "00". The compression circuit 111 compares the values of the bits in each bit-pair with each other, determines that they all match, and compresses $2n$ bits of the bit-pairs into n bits having the value "1100" in a second compression burst CB1. In the same manner, the third burst B2 comprised of bit-pairs "11", "00", "11", and "00" is compressed into a third compression burst CB2 having the value "1010."

As described above, assuming that all bit-pairs within each of the 16 bursts CB0, CB1, CB2, CB3, . . . , CB15 of the data Dm are comprised of matching bits, each of the bit-pairs are compressed to one bit, such that the compressed data $CDQ_I$ is 64 bits long compressed from the 128 bits of the data Dm. However, because one bit according to flag information CF indicating compression or non-compression of data is added to each burst, information actually needed for data recovery, that is, information needed to decompress the compressed data $CDQ_I$, is 80 bits long (See FIG. 4).

Referring to FIGS. 3 and 4, if all bursts of the data Dm are compressed, a compression rate of the compression circuit 111 may be calculated as $80/128$, i.e., 62.5%.

Although the above-mentioned embodiment discloses compressing the data Dm in units of a burst occurring at one point in time, the data Dm may also be compressed in units of data through one connector. Accordingly, in another embodiment, when the first data D0 may have 16 bits denoted by "0110110110110110" as shown in FIG. 3, the values of 8 bit-pairs corresponding to the 16 bits may be compared and compressed according to a certain compression scheme, and each of D1 through D7 may be similarly compressed.

Referring to FIG. 4, the data Dm having the input/output (I/O) width of 8 bits is converted and compressed into 4 bits of compressed data $CDQ_I$.

Referring to FIG. 5, the padding circuit 113 pads the 4 bits of compressed data $CDQ_I$ with a plurality of dummy bits D, generating Tx data $DQ_P$ having an I/O width of 8 bits. The padding circuit 113 provides the Tx data $DQ_P$ to the transmitter 120, which transmits the Tx data $DQ_P$ to the memory device 200. The memory device 200 may discard the dummy bits on the basis of the flag information CF, and decode the remainder of the received TX data $DQ_P$ to recover the data Dm.

In an embodiment, if all bits of the data Dm are compressed as shown in relation to FIG. 3, only compression data $CDQ_I$ and flag information CF may be supplied to the memory device 200. For example, if all data Dm is compressed as shown in FIG. 4, each of the compression bursts CB0, . . . , CB15 has 4 bits, and therefore a predetermined amount of I/O pads may not be used since an amount of transmission data is reduced. In an embodiment wherein the data Dm has a burst length of 16 and is transmitted through first through eighth I/O pads, the compressed data $CDQ_I$ may be transmitted only through the first through fourth I/O pads, and non-used I/O pads, e.g., the fifth through eighth I/O pads, may be used for transmission of flag information CF or for transmission/reception of other signals.

However, because all of the data Dm is not always compressed, the padding circuit 113 fills the compressed data $CDQ_I$ with dummy bits.

FIG. 5 shows not only Tx data generated by the padding circuit 113, but also flag information.

As can be seen from FIG. 5, each dummy bit is denoted by "D". The dummy bits may be "0" or "1", and all of the dummy bits used as padding bits may have a same value. In an embodiment, the bits used as the dummy bits may be predetermined bits, and may be bits capable of minimizing power consumed for data transmission/reception (Tx/Rx).

In another embodiment, the dummy bits may be determined on the basis of bit values comprising the compressed data $CDQ_I$. In FIG. 3, the number of '0' bits is identical to the number of '1' bits in each unit of the data Dm being compressed. However, if the number of '0' bits and the number of '1' bits differ, the dummy bit(s) may be filled according to the value corresponding to the majority of the bits, which may minimize the power consumption needed for bit conversion.

However, bit-pairs included in the data Dm may include bits having the same bit values or different bit values. In other words, although the data Dm of FIG. 3 show the case in which all bit-pairs have matching bit values, the matching bit values may not always be present in the bit-pairs, and as a result data compression may not be performed.

In an embodiment, the data processing apparatus 10 is configured to perform data compression even in the case in which two contiguous bits of the data Dm are not identical when operating in a loss mode, according to a compression scheme indicated by the mode signal mode.

FIGS. 6 through 9 illustrate an operation in a loss mode of the data processing apparatus 10 according to an embodiment. FIG. 6 shows data Dm to be compressed, and FIGS. 7 through 9 each show transmission data $DQ_P$ generated when the data Dm is compressed in different ways according to the mode signal mode.

In the same manner as in FIG. 3, FIG. 6 shows the data Dm with a burst length of 16, with each of the 16 bursts B0, B1, B2, . . . , B15 having 8 bits of the data Dm.

Referring to FIG. 6, in all the bursts other than the fourth burst B3, the eighth burst B7, the twelfth burst B11, and the fifteenth burst B14, the bits in all pairs of two contiguous bits are identical. Each burst in which all pairs of two contiguous bits are identical may be compressed into 4 bits, and flag information CF associated with the burst is generated as '1,' as shown in FIG. 7. The compression formats of lossless compressed data CB0, CB1, CB2, CB4, CB5, CB6, CB8, CB9, CB10, CB12, CB13, and CB15 in FIG. 7 are identical to the compression formats used in FIG. 5.

In order to compress the fourth burst B3, eighth burst B7, twelfth burst B11, and fifteenth burst B14 of FIG. 6, each of which includes 8 bits of data and has at least one 2-bit pair having different bits, some bits are lost.

To compress the 8 bits comprising the fourth burst B3 of the data Dm, one of the third bit "0" and the fourth bit "1" is lost. Likewise, to compress the eighth burst B7, two of the third bit "1", fourth bit "0", seventh bit "1", and eighth bit "0" of the eighth burst B7 are lost. To compress the twelfth burst B11, two of the third bit "0", fourth bit "1", seventh bit "1", and eighth bit "0" of the twelfth burst B11 are lost. Finally, to compress the fifteenth burst B14, one of the third bit "0" and the fourth bit "1" of the fifteenth burst B14 is lost.

FIG. 7 shows a case in which the mode signal mode corresponds to the lossless mode. During the lossless mode, even one bit from among all bits should not be lost or damaged by data compression. Accordingly, the compression circuit 111 does not compress the fourth burst B3, the eighth burst B7, the twelfth burst B11, and the fifteenth burst B14, and instead transmits these bursts B3, B7, B11, and B14 as compressed data $CDQ_I$ without change, and generates flag information CF of the value of "0" indicating an uncompressed state for each of these bursts.

Since all 8 bits of information are included in each of the fourth burst B3, eighth burst B7, twelfth burst B11, and fifteenth burst B14, the padding circuit 113 does not insert dummy bits into the bursts B3, B7, B11, and B14.

The memory device 200 having received transmission data $DQ_P$ may detect an uncompressed state of a specific burst on the basis of the flag information CF, and may record the corresponding burst in the storage circuit 230 without change. In the case shown in FIG. 7, the memory device 200 may determine that each of the fourth bit, the seventh bit, the twelfth bit, and the fifteenth bit of the flag information CF is set to "0," and that the corresponding fourth, seventh, twelfth, and fifteenth bursts of the transmission data $DQ_P$ are uncompressed.

In the case shown in FIG. 7, in which data loss caused by compression is not allowed, 12 bursts except the fourth, seventh, twelfth, and fifteenth bursts are compressed into 4 bits to produce a total of 48 bits, 4 bursts of 8 bits, i.e., the fourth, seventh, twelfth, and fifteenth bursts, remain uncompressed to produce a total of 32 bits, and the flag information CF is composed of 16 bits, such that a total number of bits is 96 (=48+32+16). Accordingly, the compression rate is calculated as $96/128$, i.e., 75%.

FIG. 8 illustrates the compressed data $CDQ_I$ produced when the mode signal mode corresponds to the loss mode. In FIG. 8, although bit loss caused by compression is allowed, only one bit is allowed to be lost for each burst serving as a data compression unit.

Accordingly, the compression circuit 111 compresses the fourth burst B3 and the fifteenth burst B14 in which the third bit "0" and the fourth bit "1" are different from each other, i.e., only one bit-pair has different bits therein. The eighth burst B7 and the twelfth burst B11, each of which would lose two bits as a result of the compression, are not compressed since the eighth burst B7 and the twelfth burst B11 each includes two bit-pairs having different bits therein, i.e., a bit-pair of D2 and D3 and a bit-pair of D6 and D7.

When performing data compression in the loss mode, one of the third bit and the fourth bit is replaced with another bit to permit the compression, and data compression is then carried out. The compression circuit 111 selects which bit will be replaced with another bit.

In an embodiment, when data is lost, all the lost bits may be replaced with the same bit value. Accordingly, in an embodiment, when data is lost and compressed, the lost data may be replaced with "0," so that in the fourth burst B3 of FIG. 6, "00011111" is replaced with "00001111", such that the resultant data can be compressed into "0011," as shown in FIG. 8. In another embodiment, the lost data may be replaced with "1," so that in the fourth burst B3 of FIG. 6, "00011111" is replaced with "00111111", such that the resultant data can be compressed into "0111."

In another embodiment, one of the two bits in a bit-pair wherein a bit must be lost may be replaced with the other bit of the bit-pair, such as the more significant bit replacing the less significant bit of the bit-pair, and the resultant data may then be compressed. Accordingly, if the fourth bit of a burst is not identical to the third bit of the burst, and the fourth bit is determined to be more significant than the third bit, the third bit is replaced with the value of the fourth bit. That is, in the case of the fifteenth burst B14, "11011100" is replaced with "11111100", such that the resultant data can be compressed into "1110".

In FIG. 8, because the third burst B4 and the fifteenth burst B14 are compressed, the associated flag information CF is generated with the value of 1 to indicate this compression state.

If loss of one bit is allowed as shown in FIG. 8, all the non-dummy bits of the Tx data $DQ_P$ are 88 bits and therefor have a compression rate denoted by $88/128$, i.e., 68.75%. The compression using the loss mode, as shown in FIG. 8, has higher compression efficiency than the compression using the lossless mode, as shown in FIG. 7. However, the compression shown in FIG. 8 introduces an error such that 2 bits from among the 128 bits are different from the corresponding bits in FIG. 6, such that in the case shown in FIG. 8, the compression using the loss mode has an error rate of 1.56%.

FIG. 9 illustrates compression when the mode signal mode corresponds to the loss mode and up to two bits are allowed to be lost for each burst serving as a data compression unit.

When the mode signal mode indicates that up to two bits may be lost, the compression circuit 111 may compress the eighth burst B7 and the twelfth burst B11. In each of the eighth and twelfth bursts B7 and B11, the third bit and the fourth bit constituting a bit-pair are not identical, and the seventh bit and the eighth bit constituting a bit-pair are not identical.

In an embodiment, the compression circuit 111 may receive a mode signal mode that allows the loss of up to two bits per burst and also specifies that an LSB is replaced with an MSB to compress the lost bits.

The compression circuit 111 replaces the eighth burst B7 of "11100010" with "11000000", compresses the resultant data into "1000", and generates flag information CF of "1".

Similarly, the compression circuit 111 replaces the twelfth burst B11 of "11011110" with "11111100", compresses the resultant data into "1110", and generates flag information CF of "1".

In FIG. 9, the padding circuit 113 may pad the compressed data $CDQ_I$ with dummy pad(s). As described above, the dummy bits may be predetermined bits, or the dummy bits may be generated on the basis of the values of bits included in the compressed data $CDQ_I$.

In more detail, the fourth compression burst CB3 includes three bits of "1" and one bit of "0". Because the number of "1" bits is greater than the number of "0" bits, the dummy bits padded to the fourth compression burst CB3 may be set to "1." Similarly, in the eighth compression burst CB7, the number of "0" bits is greater than the number of "1" bits, and accordingly the dummy bits padded to the eighth compression burst CB7 may be set to "0."

Considering the efficiency of the compression scheme illustrated by FIG. 9, which scheme uses a loss mode allowing 2 bits of loss per compression unit, all bursts of the data Dm are compressed. Therefore the Tx data $DQ_P$ has 80 valid bits, and the compression rate is $80/128$, i.e., 62.5%, which is a higher compression rate than that of the lossless compression shown in FIG. 7. However, there arises an error of 6 bits in the compression illustrated by FIG. 9, such that the compression scheme illustrated by FIG. 9 has a total error rate of 4.69%.

In FIG. 9, there arises an error of 6 bits within the 128 bits of contemporaneously transmitted data. In an embodiment, the number of erroneous bits may be based on a specific unit determined by the mode signal mode. The mode signal mode may specify that, e.g., an error of more than 5 bits within the 128 bits of contemporaneously transmitted data may not be allowed.

Although the mode signal mode may indicate that the compression circuit 111 may allow the loss of two bits per burst in the loss mode, the compression circuit 111 may allow the loss of a maximum of 5 bits among the 128 bits, and may not compress remaining bits other than the 5 bits. When deciding which bits will not be compressed, MSBs may have priority.

In another embodiment, the mode signal mode may decide an error rate which limits the number of allowable lost bits. The number of allowed lost bits may be determined in proportion to the number of bits of data transmitted during a predetermined time.

In the data processing apparatus 10 according to an embodiment, the compression rate and the error rate have a trade-off relationship. Accordingly, the mode signal mode may indicate that a higher compression rate is allowed according to an acceptable number of bit errors, or may indicate that accurate data is desired and the data compression should be performed without introducing errors.

FIG. 10 illustrates an embodiment in which flag information CF is transmitted using the same physical connector as in Tx data $DQ_P$. The flag information CF is inserted before the bursts CB0, CB1, . . . , CB15 of Tx data $DQ_P$. For convenience of description, first compression flag information is denoted by CF0, and second compression flag information is denoted by CF1.

In FIGS. 4, 5, 7, 8, and 9, the relationship between flag information CF and Tx data $DQ_P$ is a parallel relationship. The parallel relationship may indicate that Tx data $DQ_P$ and flag information CF are communicated between the controller 100 and the memory device 200 through physically separate connectors.

In the embodiment shown in FIG. 10, an additional connector for the flag information CF is not required, and the flag information CF may be transmitted/received using the connector used for transmitting/receiving the Tx data $DQ_P$.

FIG. 10 illustrates the insertion of the flag information CF before the Tx data $DQ_P$. Flag information shown in FIGS. 4, 5, 7, 8, and 9 can be inserted either directly before or directly after the Tx data $DQ_P$. In another embodiment, the flag information CF may be inserted at a specific time relative to the transmission time of the Tx data $DQ_P$.

The Tx data $DQ_P$ shown in FIG. 10 has 16 bits of flag information CF, each bit of the flag information CF being associated with one of the 16 bursts, and each burst having an I/O width of 8 bits. Flag information CF is generated using the compression circuit 111, and may be supplied to the transmitter 120 after passing through the padding circuit 113.

The transmitter 120 may parallelize the Tx data $DQ_P$ and the flag information CF according to the connector used for transmission of the flag information CF, as shown in FIG. 10.

Because the flag information CF is 16 bits long, two bursts each comprising 8 data bits DQ0 through DQ7 are allocated to the flag information CF, and the flag information CF may be inserted as two bursts immediately in front of the Tx data $DQ_P$, the two bursts comprising the first and second compression flag information CF0 and CF1. The first compression flag information CF0 may indicate whether the first through eighth compression bursts CB0 through CB7 of the Tx data $DQ_P$ are compressed, and the second compression flag information CF1 may indicate whether or not the $9^{th}$ through $16^{th}$ compression bursts CB8 through CB15 of the Tx data $DQ_P$ are compressed.

In an embodiment, rearrangement of flag information CF may be performed by the transmitter 120. In another embodiment, rearrangement of flag information CF may be performed by the encoder 110.

Figure 11:
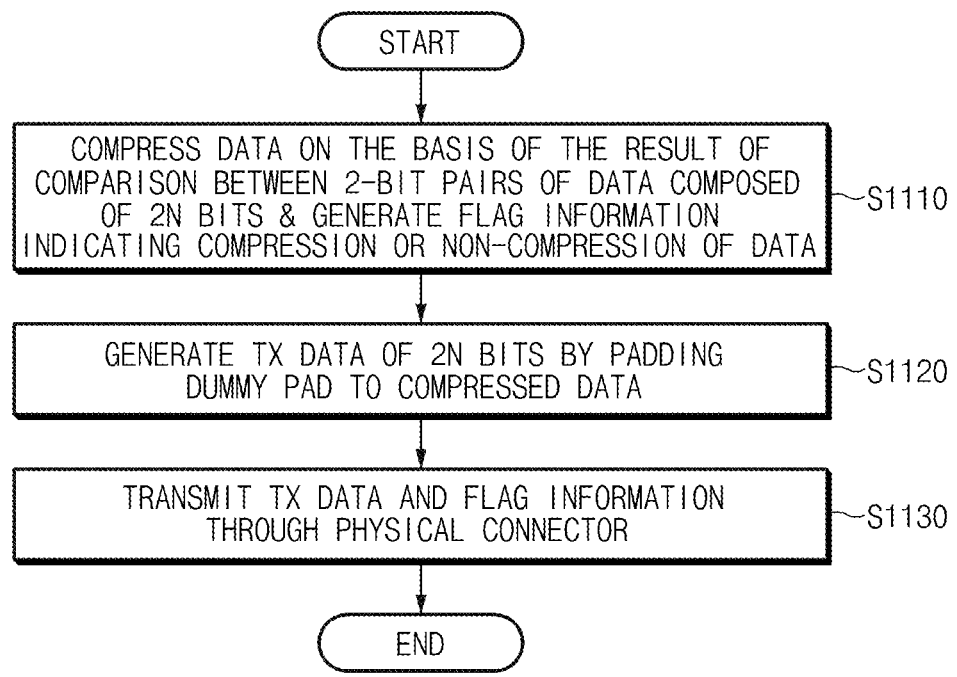
FIG. 11 illustrates a flowchart of a data processing method according to an embodiment.

FIG. 11 is a flowchart illustrating data processing according to an embodiment.

At S1110, the compression circuit 111 of the encoder 110 compares 2-bit pairs (i.e., pairs each having 2 contiguous bits) of data Dm composed of 2n bits, where 'n' is a natural number, and compresses the data Dm when the comparison produces a specified result. In addition, the compression circuit 111 generates flag information CF indicating whether compression of the data Dm was performed.

The compression circuit 111 may perform data compression in different ways according to a result of the comparison between the bits of the 2-bit pairs, according to a received mode signal mode.

If the bits of the 2-bit pairs are identical to each other, the 2-bit pairs are compressed into one identical bit (See FIGS. 3 to 5). If the bits of the 2-bit pairs are different from each other, the two bits are selectively compressed according to the mode signal mode.

If the mode signal mode corresponds to the lossless mode, two different bits are not compressed (See FIGS. 6 and 7).

If the mode signal mode corresponds to the loss mode, two different bits may be replaced with one predetermined bit, or may be replaced with one bit selected from the two different bits, and data compression is performed (See FIGS. 6, 8, and 9).

In addition, if the mode signal mode corresponds to the loss mode, bit replacement may be used for compression and the allowable degree of error may be established.

At S1120, the padding circuit 113 included in the encoder 110 may pad the compressed data with dummy bit(s), such that Tx data $DQ_P$ of 2n bits is generated.

In an embodiment, the dummy bits may be predetermined bits. In another embodiment, the compressed data is analyzed so that a specific value capable of minimizing transmission (Tx) power may be allocated as the dummy bits. For the clarity of description, the encoder 110 may be referred as a data processing system.

At S1130, the transmitter 120 may transmit the Tx data $DQ_P$ and the flag information CF through a physical connector. In an embodiment, the Tx data $DQ_P$ and the flag information CF may be transmitted through distinct physical connectors. In another embodiment, the Tx data $DQ_P$ and the flag information CF may be transmitted through the same physical connector.

The receiver 210 of the memory device 200 receives the Tx data $DQ_P$ and the flag information CF from the controller 100 through the physical connector or connectors. The decoder 220 recognizes the compression scheme of the Tx data $DQ_P$ according to the mode signal mode, and recognizes whether or not data is compressed according to the flag information CF. By use of the decoder 220, the data DM may be restored from the Tx data $DQ_P$ and may then be stored in the storage circuit 230.

Figure 12:
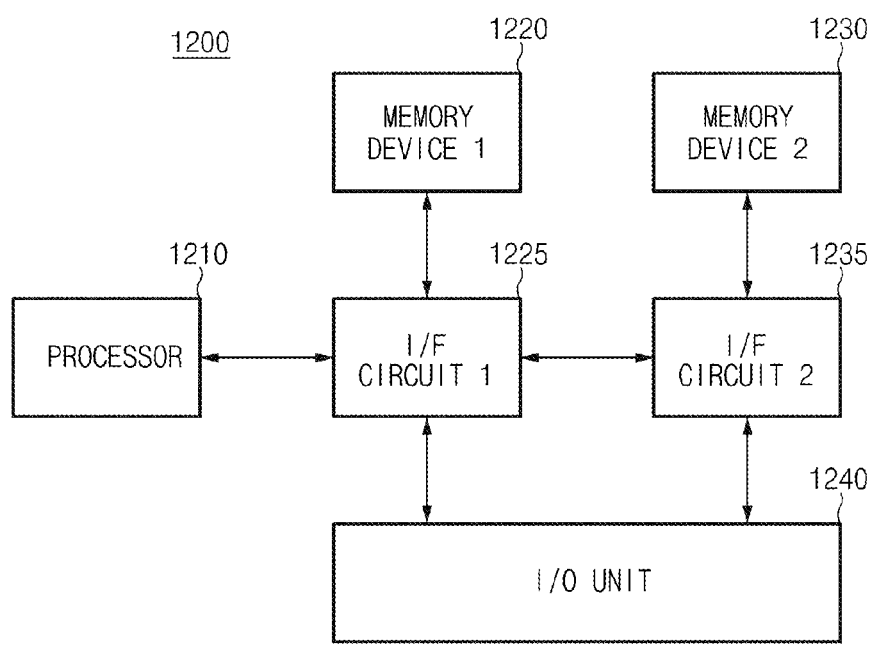
FIG. 12 illustrates a block diagram of a computing system including a data processing apparatus according to an embodiment.

FIG. 12 is a block diagram illustrating a computing system including the data processing apparatus 10 according to an embodiment. The computing system 1200 includes a processor 1210, first and second memory devices 1220 and 1230, and first and second interface (I/F) circuits 1225 and 1235.

The processor 1210 may correspond to the controller 100 of FIG. 1, and first and second memory devices 1220 and 1230 may correspond to the memory device 200 of FIG. 1.

The computing system 1200 may include various digital computers, for example, a laptop, a desktop, a workstation, a personal digital assistant (PDA), a server, a blade server, a mainframe, and the like.

Constituent elements of the computing system 1200 may be populated on a printed circuit board (PCB) such as a mother board. The processor 1210 and the first memory device 1220 may be interconnected through the first interface circuit 1225, and the processor 1210 and the second memory device 1230 may be interconnected through the second interface circuit 1235.

The processor 1210 may process a command executed in the computing system 1200. The command processed by the processor 1210 may include a command to perform high-speed data input and/or output (I/O) actions using the first memory device 1220 and a command to perform low-speed data I/O actions using the second memory device 1230. In an embodiment, multiple processors and/or multiple buses may be used along with multiple memories and memory types.

In an embodiment, the processor 1210 receives a command, such as a mode signal, indicating a data processing scheme, compares bits of 2-bit pairs of data Dm composed of 2n bits, compresses the 2-bit pairs according to the comparison result and the data processing scheme, and thereby provides Tx data $DQ_P$ and flag information CF to the memory devices 1220 and 1230.

The first memory device 1220 and the second memory device 1230 may store various pieces of information in the computing system 1200. In an embodiment, the first memory device 1220 and the second memory device 1230 may include a volatile memory device or a non-volatile memory device. The volatile memory device and the non-volatile memory device may include various circuits for writing data to and reading data from the respective memory cell array.

The first interface circuit 1225 may perform high-speed interfacing, and the first memory device 1220 may include a volatile memory cell array supporting high-speed operations. The first memory device 1220 may store various information in the computing device 1200. In an embodiment, the first interface circuit 1225 may be coupled to a high-speed extension port configured to accommodate various extension cards.

The second interface circuit 1235 may perform low-speed interfacing, and the second memory device 1230 may include a non-volatile memory cell array supporting low-speed operations. The second memory device 1230 may provide mass storage for the computing system 1200. In an embodiment, the second memory device 1230 may include one or more of a floppy disc drive, a hard disc drive (HDD), an optical disc device, a tape unit, a flash memory or other similar solid-state memory devices, a storage-area network, and combinations thereof.

In some embodiments, the second interface circuit 1235 may be coupled to a low-speed extension port. The low-speed extension port may include any of various communication ports (e.g., USB, Bluetooth, Ethernet, Wireless Ethernet, etc.) and may be coupled to a networking device through a network adaptor.

Each of the first and second memory devices 1220 and 1230 may include a plurality of memory chips. In an embodiment, either or both of the first and second memory devices 1220 and 1230 may be implemented as a plurality of stacked dies.

The first and second memory devices 1220 and 1230 may perform recovery, including decompression, of the Tx data $DQ_P$ received from the processor 1210 on the basis of the mode signal mode and the flag information CF.

The first and second interface circuits 1225 and 1235 may perform interfacing between constituent elements having different operation speeds in the computing system 1200. Arrangement of the above constituent elements shown in the drawings is disclosed for illustrative purposes only, and embodiments are not limited thereto.

In an embodiment, the computing system 1200 may further include an input/output (I/O) unit 1240. The I/O unit 1240 may include an input circuit such as a keyboard or mouse and an output circuit such as a printer or display.

Embodiments of the present disclosure may be implemented by a digital electronic circuit, an integrated circuit (IC), an application specific integrated circuit (ASIC) designed for special purposes, hardware, firmware, software, and/or a combination thereof.

The computing system 1200 may be implemented using one or more computer programs. Each computer program (also called a program, software, software application, or a code) may be implemented using one or more of machine instructions for a programmable processor, high-level procedure and/or object-oriented programming languages, and assembly/machine language.

The computer program can be executed on a programmable system. The programmable system may include at least one special-purpose or general-purpose processor, at least one input circuit, and at least one output circuit, which are coupled to a storage system for transmission/reception of data and commands.

Constituent elements of the computing system 1200 may be interconnected in an arbitrary format or may be interconnected by a digital data communication medium such as a communication network. The communication network may include one or more of a local area network (LAN), a Wide Area Network (WAN), and the Internet.

Apparatus and methods for processing data according to the embodiments may compress data using only the result of comparisons between pieces of the data without using additional information, and transmit the resultant compressed data, such that the data can be easily compressed and transmitted without difficulty.

Depending on whether a higher data compression rate or a higher data accuracy is desired, embodiments may selectively determine whether data will be lost during compression, and may determine one or more bits to be lost to facilitate the compression operation.

Embodiments compare contiguous data bit values with each other and compress the data bit values, resulting in a reduction of the amount of transmitted (Tx) data. Since the amount of Tx data is reduced, a load of an input/output (I/O) driver and of a channel can be reduced and a quality of the Tx data can be improved.

Embodiments perform data compression by comparing the values of pieces of data to be compressed, and no additional information is needed to perform the data compression.

Those skilled in the art will appreciate that embodiments may be carried out in ways other than those specifically set forth herein without departing from the spirit and essential characteristics of the present disclosure. The above embodiments are therefore to be construed in all aspects as illustrative, and embodiments are not limited thereby. The scope of the appended claims should be determined by the claims and their legal equivalents, not by the above description, and all changes coming within the meaning and equivalency range of the appended claims are intended to be embraced therein. Claims that are not explicitly cited in each other in the appended claims may be presented in combination in an embodiment or may be included as a new claim by a subsequent amendment.

Although a number of embodiments have been described, it should be understood that numerous other modifications and embodiments can be devised by those skilled in the art that will fall within the spirit and scope of the present disclosure. Particularly, numerous variations and modifications are possible in the component parts and/or arrangements which are within the scope of the disclosure, the drawings, and the accompanying claims. In addition to variations and modifications in the component parts and/or arrangements, alternative uses will also be apparent in light of the disclosures and teachings herein to those skilled in the art.

What is claimed is:

1. A data processing device comprising:
    a compression circuit configured to compare pairs of two contiguous bits of data composed of 2n bits, where n is a natural number, and compress the data based on a result of the comparison; and
    a padding circuit configured to generate transmission data of 2n bits by padding the compressed data with a dummy pad,
    wherein when bits of a pair of two contiguous bits have different values, the compression circuit is configured to replace a bit of the pair of bits so that the pair of bits have identical values and compress the pair of bits having the identical values.

2. The data processing device of claim 1, wherein:
    if bits of a pair of two contiguous bits have a same value, the compression circuit compresses the pair into one bit having the same value.

3. The data processing device of claim 1, wherein if bits of a pair of two contiguous bits have different values, the compression circuit selectively compresses the pair according to a mode signal.

4. The data processing device of claim 3, wherein if the mode signal corresponds to a lossless mode, the compression circuit does not compress the pair.

5. The data processing device of claim 3, wherein if the mode signal corresponds to a loss mode, the compression circuit replaces a bit in the pair with a predetermined bit, and then performs data compression.

6. The data processing device of claim 5, wherein the number of replaced bits in the data is equal to or less than a predetermined number, or is equal to or less than a number corresponding to a predetermined rate.

7. The data processing device of claim 3, wherein:
    if the mode signal corresponds to a loss mode, the compression circuit replaces the bits of the pair with a single bit selected from among the two bits.

8. The data processing device of claim 7, wherein the compression circuit sequentially assigns priority in order from a most significant bit (MSB) to a least significant bit (LSB), and selects the single bit.

9. The data processing device of claim 1, wherein the dummy pad is generated based on a bit value included in the compressed data.

10. The data processing device of claim 1, wherein the compression circuit generates flag information indicating compression or non-compression of the data.

11. The data processing device of claim 10, further comprising a transmitter configured to transmit the flag information and the transmission data.

12. The data processing device of claim 11, wherein the transmitter transmits the transmission data through a first connector, and transmits the flag information through a second connector that is separate from the first connector.

13. The data processing device of claim 11, wherein the transmitter sequentially transmits the transmission data and the flag information through a connector.

14. The data processing device of claim 11, further comprising:
    a receiver configured to receive the transmission data and the flag information from the transmitter; and
    a decoder configured to recover the data by decompressing the transmission data.

15. The data processing device of claim 14, further comprising a storage circuit configured to store the recovered data.

16. A data processing method comprising:
    comparing, using a data processing system, pairs of two contiguous bits of data composed of 2n bits, where n is a natural number;
    compressing, using the data processing system, the data based on a result of the comparison;
    generating, using the data processing system, flag information indicating whether the data was compressed;
    generating, using the data processing system, transmission data of 2n bits by padding a dummy pad to the compressed data; and
    transmitting, using a transmitter, the transmission data and the flag information through a connector
    wherein compressing the data includes:
        when bits of a pair of two contiguous bits of the data have different values, replacing a bit of the pair of bits so that the pair of bits have identical values and compressing the pair of bits having the identical values.

17. The data processing method of claim 16, wherein compressing the data based on the result of the comparison includes:
    when bits of a pair of two contiguous bits have a same value, compressing the pair into one bit having the same value; and
    when the bits of the pair of two contiguous bits are not identical, selectively compressing the pair according to a mode signal.

18. The data processing method of claim 17, wherein:
when the bits of the pair are not identical and the mode signal corresponds to a lossless mode, the pair is not compressed; and
when the bits of the pair are not identical and the mode signal corresponds to a loss mode, the bits of the pair are each replaced with one predetermined bit or with a single bit selected from among the bits, and the pair having the replaced bits is compressed.

19. The data processing method of claim 18, wherein during the loss mode, the mode signal determines a maximum allowable number of bits that are to be lost from among the data.

20. The data processing method of claim 17, wherein the dummy pad is determined according to the number of bits in the compressed data having a first bit value.

* * * * *